United States Patent
Su

(10) Patent No.: US 7,676,204 B2
(45) Date of Patent: Mar. 9, 2010

(54) RADIO RECEIVER HAVING IGNITION NOISE DETECTOR AND METHOD THEREFOR

(75) Inventor: Jie Su, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 469 days.

(21) Appl. No.: 11/746,792

(22) Filed: May 10, 2007

(65) Prior Publication Data
US 2008/0280582 A1 Nov. 13, 2008

(51) Int. Cl.
*H04B 1/10* (2006.01)
*H04Q 7/20* (2006.01)

(52) U.S. Cl. ........................................ 455/223; 455/296

(58) Field of Classification Search ......... 455/218–224, 455/296, 312
See application file for complete search history.

(56) References Cited

U.S. PATENT DOCUMENTS

| | | | |
|---|---|---|---|
| 3,873,925 A | 3/1975 | Eastmond | |
| 4,334,317 A | 6/1982 | Beesley | |
| 4,654,885 A | 3/1987 | Meszko et al. | |
| 4,704,736 A | 11/1987 | Kasser | |
| 5,583,891 A | 12/1996 | Espe et al. | |
| 5,794,136 A | 8/1998 | Buchwald et al. | |
| 6,347,146 B1 | 2/2002 | Short et al. | |
| 2005/0143109 A1 | 6/2005 | Ohashi | |
| 2007/0049227 A1* | 3/2007 | Su | 455/223 |

FOREIGN PATENT DOCUMENTS

| | | |
|---|---|---|
| JP | 61-200722 A | 9/1986 |
| JP | 2005-217603 A | 10/2005 |

* cited by examiner

*Primary Examiner*—Lee Nguyen
(74) *Attorney, Agent, or Firm*—Daniel D. Hill; Ranjeev Singh

(57) ABSTRACT

An AM receiver including an AM demodulator for demodulating an AM signal received by an antenna coupled to the AM demodulator is provided. The AM receiver further includes a bandpass filter for receiving the demodulated signal and generating a bandpass filtered signal. The AM receiver further includes a moving average filter for receiving the bandpass filtered signal and generating a moving averaged signal and a highpass filter for receiving the moving averaged signal and generating a highpass filtered signal. The AM receiver further includes an averaging filter for receiving the highpass filtered signal and generating an averaged signal and a summer for receiving the averaged signal and the highpass filtered signal and generating a difference signal. The AM receiver further includes a comparator for generating a noise blanking signal based on a comparison of the difference signal with a threshold.

20 Claims, 2 Drawing Sheets

RADIO RECEIVER HAVING IGNITION NOISE DETECTOR AND METHOD THEREFOR

BACKGROUND

1. Field

This disclosure relates generally to radio, and more specifically, to a radio receiver having an ignition noise detector and method therefore.

2. Related Art

Automobile engines generate ignition noise that can be picked by radio receivers. The ignition noise is typically in the form of broadband spikes that cause audible effects that can be heard on the radio speakers. A noise blanker is included in radios to reduce the effects of ignition noise. When a received RF (radio frequency) signal is relatively strong, ignition noise effects are negligible.

Typically noise blankers inherently do some harm to audio quality or fidelity of an audio signal. Therefore, noise blankers should only operate when the harm done is offset by the need to remove the noise spike. A noise detector is used to detect the noise and enable the noise blanker for the time when noise is detected.

Ignition noise has relatively strong energy in a frequency band of about 10 KHz (kilohertz) to about 30 KHz (ultrasonic band). Thus, ignition noise detection can be accomplished by monitoring this frequency band and the detected ignition noise can be removed using a noise blanker. However, non-ideal radio channel effects will affect the performance of an AM noise blanker, such as adjacent interference, multipath echo, etc. The non-ideal channel effects can cause falsing problems, where the false indication of ignition noise enables the noise blanker when there is no noise present. For example, when a strong adjacent AM station exists within about 10 KHz or 20 KHz away, the adjacent energy could interfere with the ignition noise detector and cause the noise detector to enable the noise blanker, thus distorting the audio signal unnecessarily.

Therefore, it would be desirable to have a radio receiver that removes ignition noise spikes without affecting the fidelity of the audio signal unnecessarily.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect of the illustrated embodiment, an AM receiver comprises an AM demodulator, a bandpass filter, a moving average filter, a highpass filter, an averaging filter, a summer, and a comparator. The AM demodulator is for demodulating an AM signal received by an antenna coupled to the AM demodulator. The bandpass filter is for receiving the demodulated signal and generating a bandpass filtered signal. The moving average filter is for receiving the bandpass filtered signal and generating a moving averaged signal. The highpass filter is for receiving the moving averaged signal and generating a highpass filtered signal. The averaging filter is for receiving the highpass filtered signal and generating an averaged signal. The summer is for receiving the averaged signal and the highpass filtered signal and generating a difference signal between the averaged signal and the highpass filtered signal. The comparator is for generating a noise blanking signal based on a comparison of the difference signal with a threshold.

In another aspect, an AM receiver comprises: means for receiving the demodulated signal and generating a bandpass filtered signal; means for receiving the bandpass filtered signal and generating a moving averaged signal; means for receiving the moving averaged signal and generating a highpass filtered signal, wherein generating the moving averaged signal comprises generating an average of the bandpass filtered signal over at least one period of a frequency corresponding to an adjacent station signal; means for receiving the highpass filtered signal and generating an averaged signal; means for receiving the averaged signal and the highpass filtered signal and generating a difference signal between the averaged signal and the highpass filtered signal; and means for generating a noise blanking signal based on a comparison of the difference signal with a threshold.

In yet another aspect, a method for generating a noise blanking signal comprises: demodulating an AM signal to generate a demodulated signal; receiving the demodulated signal and generating a bandpass filtered signal; receiving the bandpass filtered signal and generating a moving averaged signal; receiving the moving averaged signal and generating a highpass filtered signal; receiving the highpass filtered signal and generating an averaged signal; receiving the averaged signal and the highpass filtered signal and generating a difference signal between the averaged signal and the highpass filtered signal; and generating the noise blanking signal based on a comparison of the difference signal with a threshold.

Figure 1:
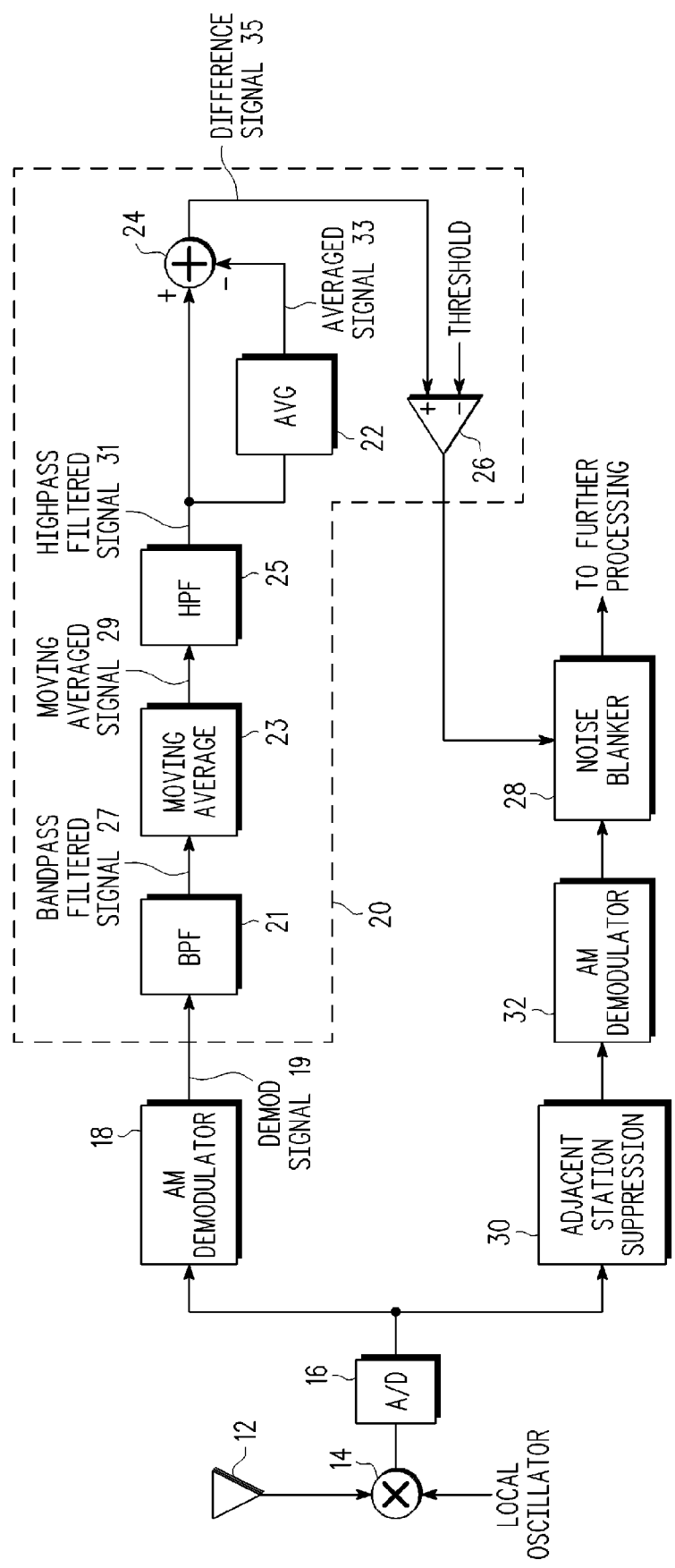
FIG. 1 illustrates an AM radio receiver in accordance with one embodiment.

FIG. 1 illustrates an AM radio receiver 10 in accordance with one embodiment. AM radio receiver 10 includes an antenna 12, mixer 14, analog-to-digital (A/D) converter 16, demodulators 18 and 32, noise detector 20, adjacent station suppression 30, and noise blanker 28. Noise detector 20 includes bandpass filter (BPF) 21, moving average filter 23, highpass filter (HPF) 25, averaging filter 22, summer 24, and comparator 26. AM receiver 10 has an audio signal path that includes adjacent station suppression block 30, AM demodulator 32, and noise blanker 28. The noise detector path is different from the audio signal path and includes AM demodulator 18 and noise detector 20. Note that noise detector 20 is implemented as software in a digital signal processor (DSP) in the illustrated embodiment. In other embodiments noise detector 20 may be implemented in hardware or in a combination of hardware and software. Also, in one embodiment, AM radio receiver 10 is mounted in an automobile (not shown).

Antenna 12 is connected to a first input of mixer 14. Mixer 14 has a second input for receiving a local oscillator signal, and an output connected the input of A/D converter 16. A/D converter 16 has an output coupled to the inputs of AM demodulator 18 and adjacent station suppression block 30. Note that in other embodiments there may be more than one antenna connected to mixer 14. Also, a switch (not shown) may be connected between the antenna 12 and mixer 14 in other embodiments. Adjacent station suppression block 30 has an output connected to an input of AM demodulator 32. AM demodulator 32 has an output connected to an input of noise blanker 28. AM demodulator 18 has an output connected to an input of noise detector 20.

In noise detector 20, BPF 21 has an input connected to an output of AM demodulator 18, and an output for providing a bandpass filtered signal labeled "BANDPASS FILTERED SIGNAL 27". Moving average filter 23 has an input connected to the output of BPF 21, and an output for providing moving average signal 29. Highpass filter 25 has an input connected to the output of moving average filter 23, and an output for providing a highpass filtered signal labeled "HIGHPASS FILTERED SIGNAL 31". Averaging filter 22 has an input connected to the output of HPF 25, and an output for providing an averaged signal labeled "AVERAGED SIGNAL 33". Summer 24 has a positive input connected to the output of HPF 25, a negative input connected to the output of averaging filter 22, and an output for providing difference signal 35. Comparator 26 has a positive input connected to the output of summer 24, a negative input for receiving a threshold signal, and an output connected to a control input of noise blanker 28.

Generally, noise detector 20 detects ignition noise in an audio signal in the presence of a relatively strong adjacent station signal, where the strong adjacent station is within about 10 KHz or 20 KHz away from the tuned station. Generally, ignition noise is generated by an operating gasoline powered internal combustion engine. Noise detector 20 detects the ignition noise using BPF 21, moving average 23, HPF 25, averaging filter 22, summer 24, and comparator 26. Bandpass filter 21 is used to remove the tuned audio signal from the noise detector signal path. Then, moving average filter 23 is used to remove the 10 KHz or 20 KHz separation frequency from the adjacent station while the ignition noise and audio information of the adjacent station remains in the signal. Highpass filter 25 is used to "sharpen" the ignition noise. The sharpened signal is then averaged, and the average is subtracted from the highpass filtered signal to produce a difference signal labeled "DIFFERENCE SIGNAL 35" that is then compared to a threshold labeled "THRESHOLD". The output of the comparator is then used to control a noise blanker circuit. Noise detector 20 provides the advantage of being able to detect an ignition noise spike in the presence of a relatively strong adjacent station signal with fewer false indications caused by the adjacent station signal.

Figure 2:
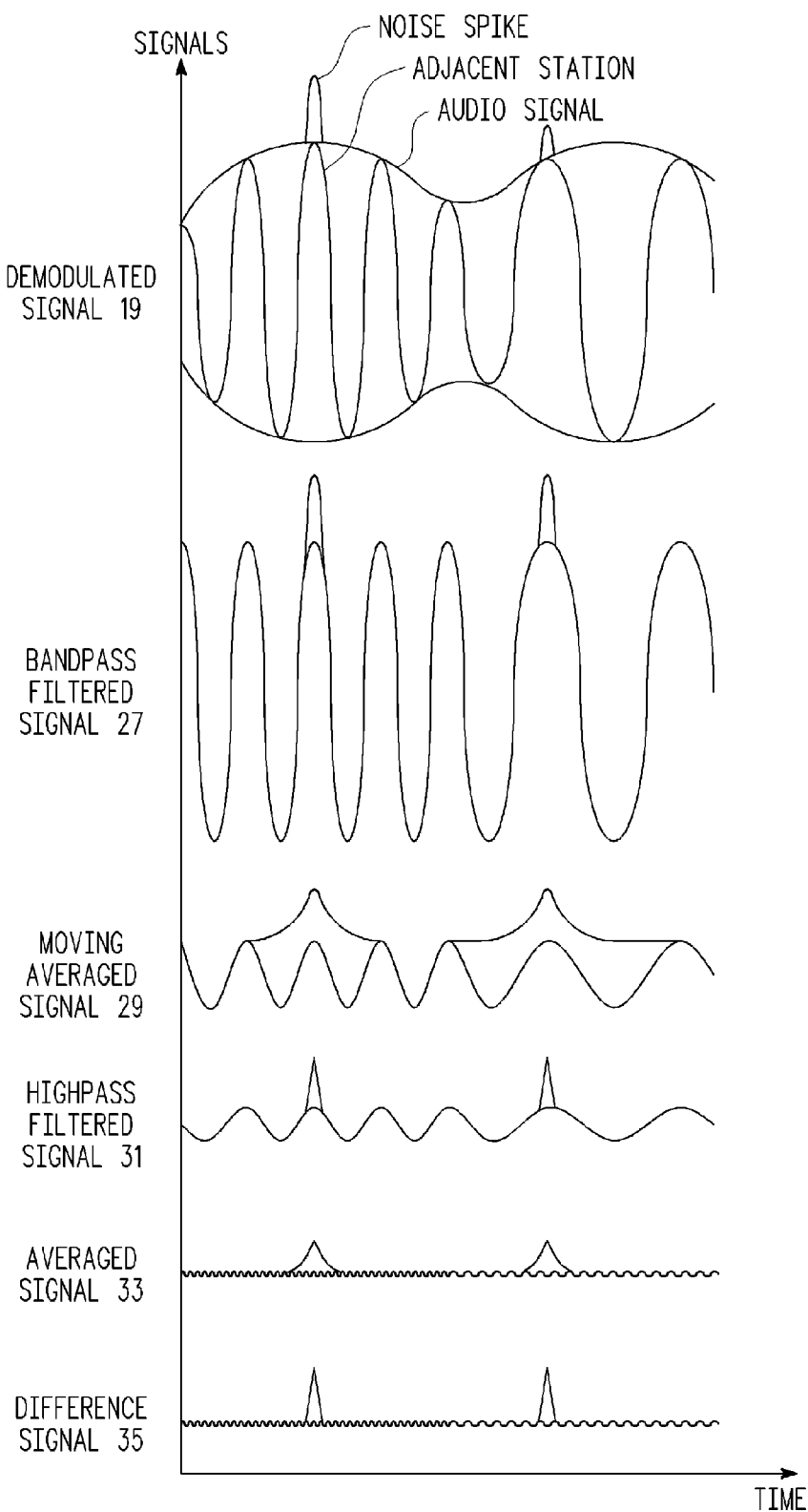
FIG. 2 illustrates various signals of the AM radio receiver of FIG. 1.

More specifically, FIG. 2 illustrates various signals of AM receiver 10 of FIG. 1 that are useful for understanding the illustrated embodiment. The operation of AM receiver 10 will be described with reference to both FIGS. 1 and 2. In operation, a broadcast AM signal is received by antenna 12. The AM signal is mixed with a local oscillator by mixer circuit 14. A/D converter 16 converts the analog signal to a digital signal. The digital AM signal is provided to demodulator 18. Demodulator 18 provides a demodulated signal labeled "DEMOD SIGNAL 19" to an input of bandpass filter 21 of noise detector 20. As illustrated in FIG. 2, the demodulated signal 19 includes the demodulated audio signal that AM receiver 10 is tuned to receive, the relatively strong adjacent station signal that is 10 KHz or 20 KHz away, and two ignition noise spikes from an automobile. Bandpass filter 21 is designed to have a pass band of about 10 KHz to about 30 KHz. Bandpass filter 21 receives the demodulated signal 19 and provides a signal labeled "BANDPASS FILTERED SIGNAL 27" as illustrated in FIG. 2. In FIG. 2, the bandpass filter 21 removes the audio signal, resulting in a relatively constant amplitude of the bandpass filtered signal 27. The bandpass filtered signal 27 is provided to an input of moving average filter 23. Moving average filter 23 provides a moving averaged signal 29 (see FIG. 2) that represents an averaged amplitude of bandpass filtered signal 27 over a predetermined time period. The predetermined time period is based on a period of the 10 KHz frequency. The operation of the moving average filter 23 can be represented by the following equation:

$$y_k = \left( \sum_{i=-M}^{M-1} x_{k+i} \right) / 2M$$

where, $x_k$ and $y_k$ are the input and output signals of moving average filter 23 respectively, and i and k represent a timing sequence used by moving average filter 23. The variable M is chosen such that 2M samples will represent exactly one cycle of the 10 KHz frequency. One cycle of 10 KHz is used to determine M so that the moving average filter 23 will provide an average for an entire cycle for a 10 KHz away adjacent station. Likewise, the moving average filter 23 will average over two cycles for a 20 KHz adjacent station for the same M. The moving average filter 23 will have a constant output signal for a 10 KHz or 20 KHz input. The moving averaged signal 29 is provided to an input of highpass filter 25. Highpass filter 25 provides highpass filtered signal 31 to a positive input of summer 24, and to an input of averaging filter 22. In the illustrated embodiment, averaging filter 22 is implemented as a conventional lowpass filter and provides averaged signal 33 to a negative input of summer 24. Averaged signal 33 is illustrated in FIG. 2. In response to receiving the highpass filtered signal 31 and the averaged signal 33, summer 24 provides difference signal 35 to a positive (+) input of comparator input 26. Comparator 26 receives a threshold value labeled "THRESHOLD" at a negative (−) input and compares the THRESHOLD to the difference signal 35. The output of comparator 26 is used to enable and disable noise blanker 28. When difference signal 35 is greater than the THRESHOLD value, noise detector 20 has detected ignition noise and comparator 26 provides an output signal to enable operation of noise blanker 28. When difference signal 35 is less than the THRESHOLD value, then no noise is being detected and noise blanker 28 is disabled to prevent the noise blanker from distorting the signal unnecessarily.

When noise blanker 28 is enabled, noise blanker 28 removes or masks the ignition noise spike and substitutes an approximation of the audio signal during the time that the noise spike occurs. Note that in one embodiment, noise blanker 28 is an adaptive filter that provides a curve to approximate the audio signal. In another embodiment, a simple straight line may be used to approximate the audio signal.

The noise blanked signal from noise blanker 28 is then provided to other digital and/or analog circuits for further processing. For example, the signal may be converted back to an analog signal to drive a speaker.

By now it should be appreciated that there has been provided a noise detector having a bandpass filter, moving average filter, highpass filter, averaging filter, summer, and comparator. The noise detector removes ignition noise from an audio signal in the presence of a relatively strong adjacent station without having false indications of ignition noise when no ignition noise is present.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The term "coupled," as used herein, is not intended to be limited to a direct coupling or a mechanical coupling.

What is claimed is:

1. An AM receiver comprising:
    an AM demodulator for demodulating an AM signal received by an antenna coupled to the AM demodulator;
    a bandpass filter for receiving the demodulated signal and generating a bandpass filtered signal;
    a moving average filter for receiving the bandpass filtered signal and generating a moving averaged signal;
    a highpass filter for receiving the moving averaged signal and generating a highpass filtered signal;
    an averaging filter for receiving the highpass filtered signal and generating an averaged signal;
    a summer for receiving the averaged signal and the highpass filtered signal and generating a difference signal between the averaged signal and the highpass filtered signal; and
    a comparator for generating a noise blanking signal based on a comparison of the difference signal with a threshold.

2. The AM receiver of claim 1, wherein the bandpass filtered signal comprises an adjacent station signal and an ignition noise signal.

3. The AM receiver of claim 2, wherein the ignition noise signal corresponds to a noise generated by an engine.

4. The AM receiver of claim 2, wherein generating the moving averaged signal comprises generating an average of the bandpass filtered signal over at least one period of a frequency corresponding to the adjacent station signal.

5. The AM receiver of claim 2 further comprising a noise blanker for receiving the noise blanking signal and for blanking the ignition noise signal.

6. The AM receiver of claim 1, wherein the demodulated signal comprises an audio signal, an adjacent station signal, and an ignition noise signal, and wherein the bandpass filter removes the audio signal from the demodulated signal to generate the bandpass filtered signal.

7. The AM receiver of claim 1, wherein generating the moving averaged signal comprises generating an average of the bandpass filtered signal over an integer multiple of a period corresponding to a frequency of 10 KHz.

8. An AM receiver comprising:
    means for demodulating an AM signal;
    means for receiving the demodulated signal and generating a bandpass filtered signal;
    means for receiving the bandpass filtered signal and generating a moving averaged signal;
    means for receiving the moving averaged signal and generating a highpass filtered signal, wherein generating the moving averaged signal comprises generating an average of the bandpass filtered signal over at least one period of a frequency corresponding to an adjacent station signal;
    means for receiving the highpass filtered signal and generating an averaged signal;
    means for receiving the averaged signal and the highpass filtered signal and generating a difference signal between the averaged signal and the highpass filtered signal; and
    means for generating a noise blanking signal based on a comparison of the difference signal with a threshold.

9. The AM receiver of claim 8, wherein the bandpass filtered signal comprises an adjacent station signal and an ignition noise signal.

10. The AM receiver of claim 9, wherein the ignition noise signal corresponds to a noise generated by an engine.

11. The AM receiver of claim 9 further comprising means for receiving the noise blanking signal and for blanking the ignition noise signal.

12. The AM receiver of claim 8, wherein the demodulated signal comprises an audio signal, an adjacent station signal, and an ignition noise signal, and wherein the means for receiving the demodulated signal removes the audio signal from the demodulated signal to generate the bandpass filtered signal.

13. The AM receiver of claim 8, wherein means for generating the moving averaged signal comprises means for generating an average of the bandpass filtered signal over an integer multiple of a period corresponding to a frequency of 10 KHz.

14. A method for generating a noise blanking signal comprising:
    demodulating an AM signal to generate a demodulated signal;
    receiving the demodulated signal and generating a bandpass filtered signal;
    receiving the bandpass filtered signal and generating a moving averaged signal;
    receiving the moving averaged signal and generating a highpass filtered signal;
    receiving the highpass filtered signal and generating an averaged signal;

receiving the averaged signal and the highpass filtered signal and generating a difference signal between the averaged signal and the highpass filtered signal; and generating the noise blanking signal based on a comparison of the difference signal with a threshold.

15. The method of claim 14, wherein the bandpass filtered signal comprises an adjacent station signal and an ignition noise signal.

16. The method of claim 15, wherein the ignition noise signal corresponds to a noise generated by an engine.

17. The method of claim 15 further comprising receiving the noise blanking signal and blanking the ignition noise signal.

18. The method of claim 15, wherein generating the moving averaged signal comprises generating an average of the bandpass filtered signal over at least one period of a frequency corresponding to the adjacent station signal.

19. The method of claim 14, wherein the demodulated signal comprises an adjacent station signal, an audio signal, and an ignition noise signal, and wherein generating the bandpass filtered signal comprises passing the adjacent station signal and the ignition noise signal.

20. The method of claim 14, wherein generating the moving averaged signal comprises generating an average of the bandpass filtered signal over an integer multiple of a period corresponding to a frequency of 10 KHz.

* * * * *